United States Patent
Neugebauer et al.

(10) Patent No.: US 7,190,738 B2
(45) Date of Patent: Mar. 13, 2007

(54) DATA ASSISTED SERIAL LINK DECODER USING OVERSAMPLING

(75) Inventors: Charles F. Neugebauer, Atherton, CA (US); William Elliott, Parker, TX (US); Fritz Lebowsky, Palo Alto, CA (US); Dean Timmermann, Edmonds, WA (US)

(73) Assignee: STMicroelectronics, Inc., Carrollton, TX (US)

( * ) Notice: Subject to any disclaimer, the term of this patent is extended or adjusted under 35 U.S.C. 154(b) by 686 days.

(21) Appl. No.: 10/093,928

(22) Filed: Mar. 7, 2002

(65) Prior Publication Data

US 2003/0169831 A1    Sep. 11, 2003

(51) Int. Cl.
   *H03K 9/00*   (2006.01)
(52) U.S. Cl. ...................... 375/316; 375/355
(58) Field of Classification Search ............. 375/257, 375/316, 219, 240.26, 240.28, 355–356, 375/365–366; 327/50, 63, 72; 370/503, 370/509, 512
See application file for complete search history.

(56) References Cited

U.S. PATENT DOCUMENTS 5,999,571 A * 12/1999 Shin et al. ............... 375/292
6,151,334 A * 11/2000 Kim et al. ................ 370/468
6,877,106 B2 * 4/2005 Tomooka et al. ............ 714/4
2003/0048851 A1 * 3/2003 Hwang et al. ......... 375/240.26

OTHER PUBLICATIONS

U.S. Appl. No. 10/037,967, filed Dec. 21, 2001, Chow et al.
Digital Display Working Group, Digital Visual Interface, Revision 1.0, Apr. 2, 1999, pp. 24-32.

* cited by examiner

*Primary Examiner*—Khanh Tran
(74) *Attorney, Agent, or Firm*—Stephen C. Bongini; Lisa K. Jorgenson

(57) ABSTRACT

A communication system includes a receiver for receiving a serial bit stream from at least one communication channel, and a decoder, in communication with the receiver, for decoding words from the received serial bit stream, the words being defined at least in part by word boundaries in the received serial bit stream. The decoder contemporaneously synchronizes detection of bits and detection of the word boundaries in the received serial bit stream. The decoder preferably decodes digitized video signal information in the serial bit stream according to a Transition Minimized Differential Signalling protocol. The receiver and decoder are preferably part of an integrated circuit chip.

29 Claims, 8 Drawing Sheets

| L valid (1002) | C valid (1004) | R valid (1006) | Programmable Increment (1008) |
|---|---|---|---|
| 0 | 0 | 0 | 4 |
| 0 | 0 | 1 | 7 |
| 0 | 1 | 0 | 0 |
| 0 | 1 | 1 | 0 |
| 1 | 0 | 0 | -7 |
| 1 | 0 | 1 | 0 |
| 1 | 1 | 0 | 0 |
| 1 | 1 | 1 | 0 |

FIG. 10

DATA ASSISTED SERIAL LINK DECODER USING OVERSAMPLING

CROSS-REFERENCE TO RELATED APPLICATION

The present patent application is related to co-pending and commonly owned U.S. patent application Ser. No. 10/037,967, entitled "High Speed Differential Data Sampling Circuit", filed on Dec. 21, 2001, the entire teachings of which being hereby incorporated by reference.

BACKGROUND OF THE INVENTION

1. Field of the Invention

This invention generally relates to the field of serial data communications systems, and more particularly relates to a data assisted serial link decoder using oversampling that is suitable for use in high speed signalling such as for video serial link communications.

2. Description of Related Art

A variety of electronic devices, such as computers, monitors, flat panel displays, wireless communication devices, to name just a few, communicate data over communication links utilizing high speed electronic signals, e.g., clock signals, video signals, spread spectrum and digital wireless communication signals, etc. A predominant trend in electronic devices is the use of digital signals. As is well known to those of ordinary skill in the art, there are many advantages to representing electronic signals in digital signal form in many such electronic devices.

In particular, a digital display, such as an LCD display, receives video data from a graphics host, such as a computing platform, via a serial communication link. This serial link typically is implemented in a cable bundle that is interconnected between an output of a graphics host interface and an input of a digital display interface. The signalling across the serial link is considered an analog signal that besides the encoding of data from the graphics host, typically picks up other undesirable distortion and noise signals. The composite signal, including distortion and noise, received at the input of the digital display interface normally must be filtered, reconstructed, and decoded to recover the transmitted data and deliver it to the digital video display monitor circuits to maintain high quality in the displayed video images at the digital display.

Conventional implementations of video signal reconstruction have attempted to reconstruct a digital representation of an analog video signal as follows. An Analog-to-Digital Converter (ADC) module is driven with a sampling clock signal to sample points in an analog video signal to identify the leading and trailing edges of any signal transition in an analog video signal. The edges of a signal transition normally are not desirable sampling points for sampling the voltage amplitude of the particular video pixel (picture element). It is desirable to sample the signal in the flat region (between the edges) of the signal transition where the voltage level is stable and may be better determined from the sample point. Prior art methods drive the ADC to sample at a point in the signal that is just before the trailing edge of the signal, where the flat region was expected to be most likely stable. This sampling point is selected simply to avoid the leading and trailing edges. However, any clock jitter, for example, tends to defeat this sampling method because it is very difficult to select a sampling clock rate that avoids the trailing edge of the signal transition while intermittent jitter keeps moving the trailing edge of a signal transition relative to a time reference. Additionally, other sources of noise may be present during the flat region of the signal and a sample taken by the ADC during this noise signal will possibly provide a false measurement of signal level.

In one particular example, a computer graphics controller using frame buffer data transmits a digital video signal to a Digital-to-Analog Converter (DAC) module to provide an analog video signal at an output of a computer graphics interface. This output video signal is utilized to drive a video monitor. The video signal is coupled to an interface of a video monitor typically via a cable. The transmission via the cable medium tends to pick up noise signals and adds distortion to the analog video signal. For example, besides distortion due to capacitive and inductive effects of the cable medium, this distortion may also include jitter from the output of the computer graphics interface. On the other side of this cable medium, when receiving the analog video signal including all the noise and distortion signals, a video interface for the video monitor couples the analog video signal to a ADC module. However the graphics controller clock is not transmitted to the video monitor. For a digital video monitor, this clock must be regenerated and the sample phase adjusted to synchronize the ADC samples with the original graphics controller digital clock period. Regrettably, conventional ADC implementations have not been very successful at removing most of the noise and distortion signals from the pure analog video signal. The resulting digital representation of the video signal may include some of the noise and distortion signals, which are particularly detrimental to the quality of the video image if the clock regeneration and phase adjustment are inaccurate.

An industry initiative attempts to address some of these issues in the delivery of high speed video signals across serial data links by utilizing a signalling protocol called Transition Minimized Differential Signalling (TMDS). A TMDS transmitter, at a graphics host, is communicatively coupled to a TMDS receiver, at a digital display, via a multi-channel serial communication link (a TMDS Link). Data code words and control code words are serially transmitted across the link to deliver data while maintaining the clock signalling synchronized between the graphics host and the digital display. Bit synchronization is normally first obtained, and then a word synchronization process attempts to synchronize code word recovery to be able to reliably deliver video information, e.g., pixel data, from the graphics host across the TMDS Link and to the digital display.

However, although the industry standard defines the signalling protocol requirements and provides a recommended signal encoding algorithm, the implementation of signal recovery and code word decoding is essentially left for ad hoc implementation by manufacturers of digital displays. Lack of precise signal recovery, including removal of distortion and noise signals and accurate code word decoding, unfortunately, results in noise and distortion signals tending to pass through and affect the digital representation of the video signal, e.g., the pixel data, in the digital display. This reduces the quality of a video image, and leads to the loss of image information, that is presented via a video monitor display to a user. The result is a lower opinion of the quality of the video monitor system and a reduced commercial viability of such products.

This reduced recovered signal quality and lost information can seriously impact other communication applications as well. For example, distorted or lost information in a wireless communication signal can significantly impact or even destroy a wireless communication across a wireless communication link.

Therefore a need exists to overcome the problems with the prior art as discussed above, and particularly for a communication system utilizing a data assisted serial link decoder that is suitable for use in high speed signalling systems such as for video serial link communications.

SUMMARY OF THE INVENTION

According to a preferred embodiment of the present invention, a communication system comprises: a receiver for receiving a serial bit stream from at least one communication channel; and a decoder, communicatively coupled to the receiver, for decoding words from the received serial bit stream, the words being defined at least in part by word boundaries in the received serial bit stream, the decoder contemporaneously synchronizing to detection of bits and to detection of the word boundaries in the received serial bit stream.

According to a preferred embodiment of the present invention, a method comprises: receiving a serial bit stream from at least one communication channel; decoding words from the received serial bit stream, the words being defined at least in part by word boundaries in the received serial bit stream; and contemporaneously synchronizing detection of bits and detection of the word boundaries in the received serial bit stream.

Preferably, decoding includes three times oversampling bits from the received serial bit stream.

According to one embodiment, each word from the received serial bit stream comprises 10 bits, and the decoding includes sampling 30 bits from the received serial bit stream within a time interval substantially equal to that for receiving the 10 bits of a word from the received serial bit stream.

According to a preferred embodiment of the present invention, the plurality of valid code words comprises Transition Minimized Differential Signalling code words, and the decoding comprises synchronizing to words from the received serial bit stream by determining whether a bit pattern from the received serial bit stream matches any one of the Transition Minimized Differential Signalling code words.

According to a preferred embodiment of the present invention, a circuit supporting substrate, comprises a substrate; and an electronic circuit disposed on the circuit supporting substrate, the electronic circuit comprises:

a receiver for receiving a serial bit stream from at least one communication channel; and a decoder, communicatively coupled to the receiver, for decoding words from the received serial bit stream, the words being defined at least in part by word boundaries in the received serial bit stream, the decoder contemporaneously synchronizing to detection of bits and to detection of the word boundaries in the received serial bit stream.

In a preferred embodiment, the circuit supporting substrate comprises an integrated circuit chip that includes the substrate and the electronic circuit.

In accordance with a preferred embodiment, a computer readable medium includes computer instructions for: receiving a serial bit stream from at least one communication channel; decoding words from the received serial bit stream, the words being defined at least in part by word boundaries in the received serial bit stream; and contemporaneously synchronizing detection of bits and detection of the word boundaries in the received serial bit stream.

BRIEF DESCRIPTION OF THE DRAWINGS

FIG. 10 is a truth table showing exemplary programmable increment values for use in the decoding operational sequence of FIGS. 8 and 9, according to a preferred embodiment of the present invention.

DESCRIPTION OF THE PREFERRED EMBODIMENTS

According to a preferred embodiment of the present invention, a new communication system and method utilizes a data assisted serial link decoder for high speed signalling systems such as for high speed video serial link communications. The digital signalling is preferably accomplished using three times oversampling. This adds a more reliable bit sampling technique that is more resistant to bit jitter, as will be discussed below. The new and novel methods for data recovery and decoding, as will be discussed below, advantageously allow both bit and word boundary detection to be accomplished substantially at the same time. Further, instead of matching to a particular code word bit pattern to detect the start of codeword decoding, improved codeword alignment is obtained by matching all possible valid codewords to three oversampled bit positions to determine the start of a valid codeword in a serial bit stream. These and other advantages of preferred embodiments of the present invention will be discussed in more detail below.

Figure 1:
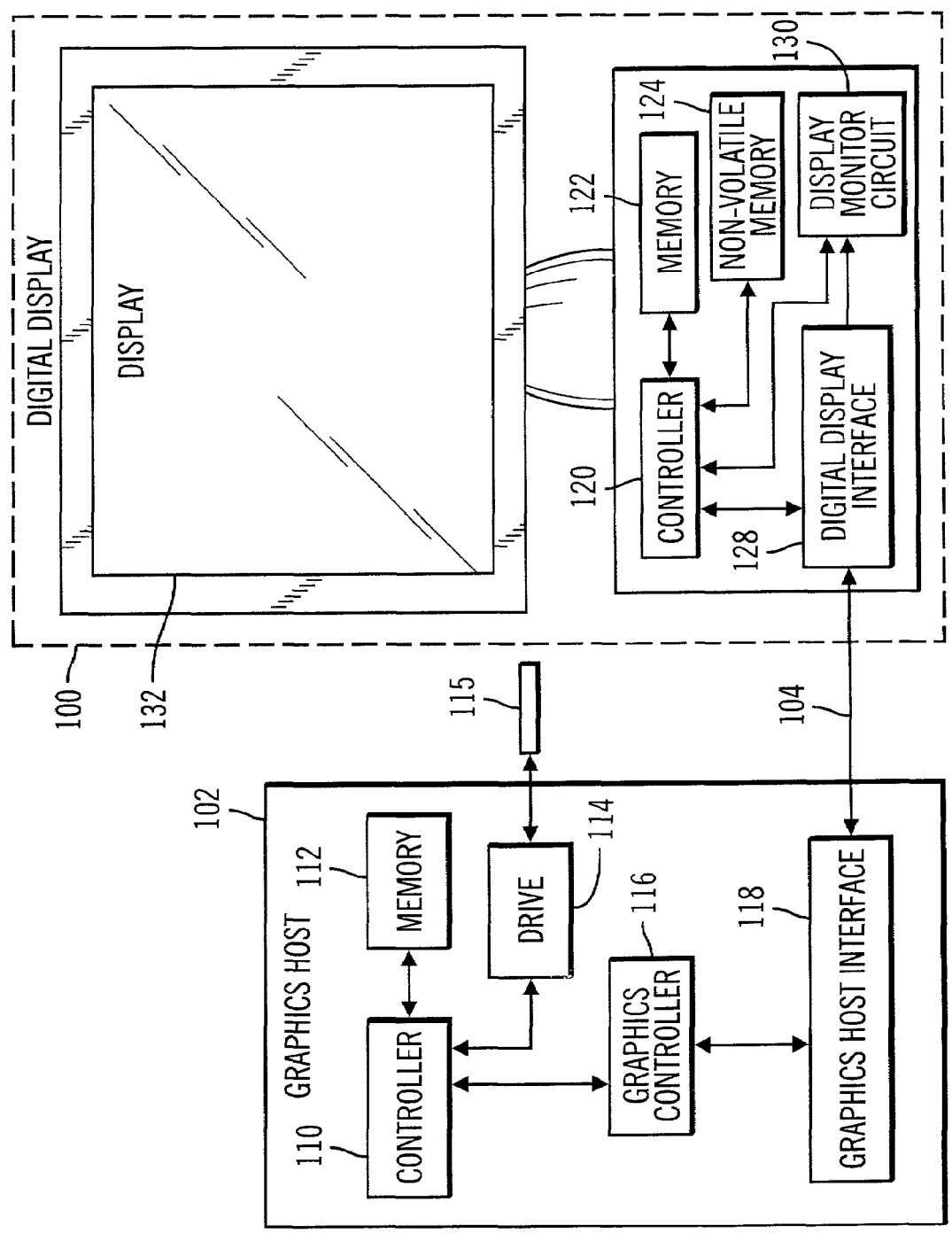
FIG. 1 is a block diagram illustrating an exemplary video signalling system in accordance with a preferred embodiment of the present invention.

Referring to FIG. 1, a digital display 100 is communicatively coupled to a graphics host 102 via a serial link 104. The serial link 104 comprises at least one communication channel for delivering at least one serial data stream between the graphics host 102 and the digital display 100. The serial link 104 may comprise wired communication medium, wireless communication medium, or a combination of both. The wireless communication medium may comprise at least one wireless communication channel such as used for any of one-way and/or two-way radio communication, for satellite communication, microwave communication, cellular communication, infrared (IR) communication, and other wireless communication as is known to those of ordinary skill in the art. In the present example, the serial link 104 comprises a plurality of wired communication media, such as in an interconnection cable, for high speed video data communication between the graphics host 102 and the digital display 100. Preferably, the serial link 104 comprises multiple video signal communication channels and is suitable for use as a Transition Minimized Differential Signalling (TMDS) link.

The graphics host 102 comprises a computer system that includes a controller/processor 110 communicatively coupled to memory 112, that may include volatile and non-volatile memory components, and to other non-volatile memory and/or storage devices 114. In this example, as shown in FIG. 1, there is shown a removable media storage drive 114. The removable storage medium 115 is readable by the computer system in a manner well known to those of ordinary skill in the art. The computer readable medium 115, in this example, is shown as a CD-RW disk 115 that can be used to deliver software and data to/from the graphics host 102. The computer readable medium 115 can also carry data and software that can be delivered to/from the digital display system 100 via the graphics host 102 and the serial link 104.

Generally, according to the preferred embodiments of the present invention, the computer system preferably includes means for reading and/or writing to the computer readable medium 115. The computer readable medium 115 allows a computer system to read data, instructions, messages or message packets, and other computer readable information from the computer readable medium. The computer readable medium, for example, may include non-volatile memory, such as Floppy, ROM, Flash memory, disk drive memory, CD-ROM, and other permanent storage. It is useful, for example, for transporting information, such as data and computer instructions, between computer systems.

The graphics host 102 comprises a graphics controller 116 for processing video information for delivery to the digital display 100. The controller/processor 110 is communicatively coupled to the graphics controller 116, and provides the video information thereto. The video information is utilized by the digital display 100 such as to display video images to a user via a video display screen 132. The graphics controller 116 communicates with the digital display via a graphics host interface 118. The graphics host interface 118 is communicatively coupled to a digital display interface 128 in the digital display 100 via the serial link 104.

The digital display interface 128 is communicatively coupled to a controller 120 in the digital display 100. The controller 120, in this example, is communicatively coupled to memory 122 and non-volatile memory 124, for storing program, data, parameters, and video information being processed by the digital display 100. The digital display 100 also comprises display monitor circuit 130 that are utilized to drive the display with video information such as to display images to a user of the digital display 100. The display monitor circuit 130 is communicatively coupled to the controller 120 and to the digital display interface 128. The video information recovered and decoded by the digital display interface is coupled to the display monitor circuit 130 to drive the display. For example, video information may include R-G-B pixel data, and synchronization and control signals such as the H-Sync and the V-Sync signals.

Figure 2:
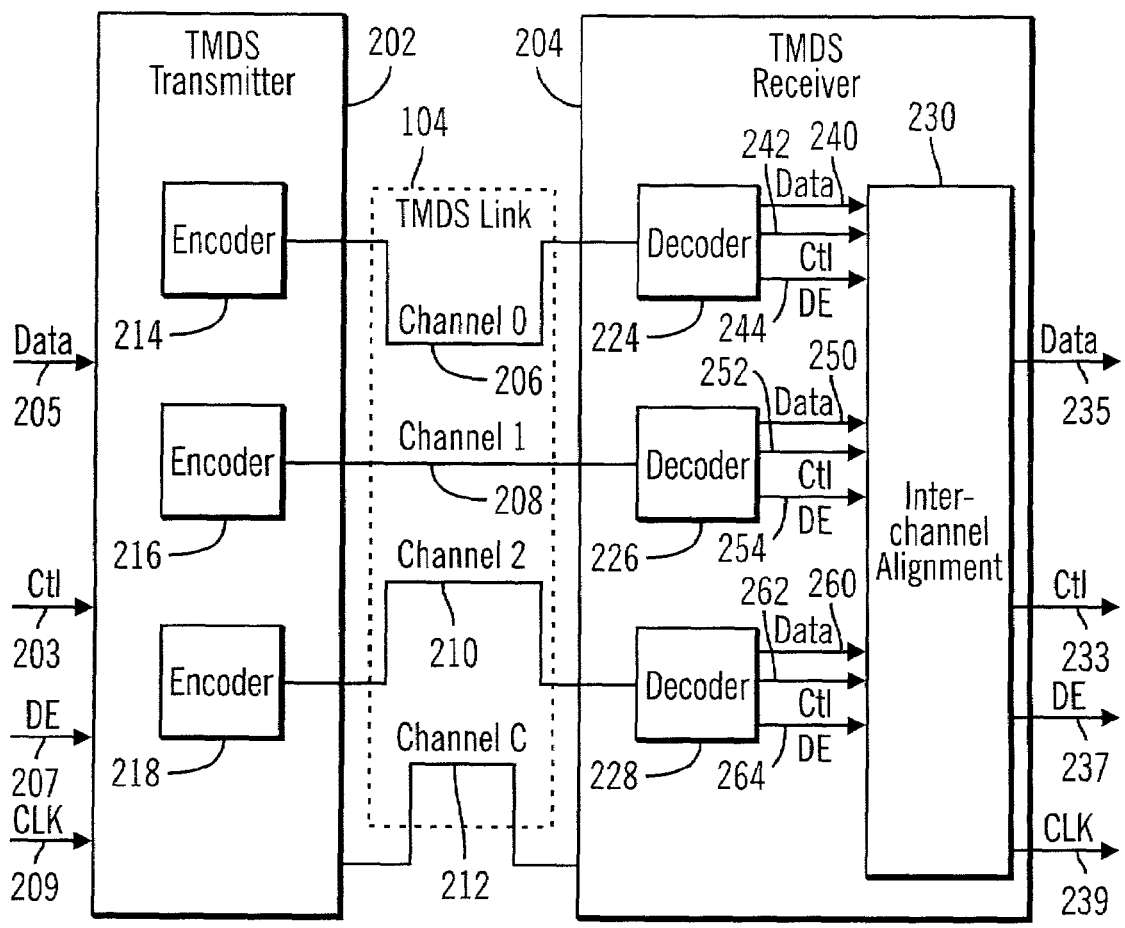
FIG. 2 is a block diagram showing a more detailed view of a portion of the video signalling system of FIG. 1 in accordance with a preferred embodiment of the present invention.

Referring to FIG. 2, a view is shown of components in the graphics host interface 118, the TMDS link 104, and the digital display interface 128, according to a preferred embodiment of the present invention. The graphics host interface 118 comprises a Transition Minimized Differential Signalling (TMDS) transmitter 202. The TMDS transmitter 202 includes encoders 214, 216, 218 that encode and serially transmit an input data stream 205 over the TMDS serial link 104. The graphics controller 116 couples pixel data to the TMDS transmitter 202 via the data input 205. Control signals, such as the H-Sync and the V-Sync signals, are received via the control input 203. A clock reference signal is received via the clock input 209. The data enable signal (DE) 207 controls whether the TMDS transmitter 202 is receiving pixel data or control information, as will be discussed in more detail below. In this example, the input data stream 205 comprises a 24-bit wide data path. Although the input stream 205 is discussed as 24 bits wide, in this example, this is not intended to limit in any way the interface formats to the TMDS transmitter 202 or TMDS receiver 204 components.

The input stream contains pixel data received via the data input 205 and control data received via the control input 203. Control signals, such as for horizontal sync (H-sync) and vertical sync (V-sync) signalling, are received at the control input 203 of the TMDS transmitter 202. The TMDS transmitter 202 encodes either pixel data at the data input 205 or control data at the control input 203 on any given input clock cycle at the clock input 209, depending on the state of the data enable signal (DE) 207. The active data enable signal 207 indicates that pixel data 205 is to be transmitted. The inactive data enable signal 207, on the other hand, indicates that control data 207 is to be transmitted. Note that control data 203 is ignored when pixel data 205 is being transmitted, and pixel data 205 is ignored when control data 207 is being transmitted.

The TMDS transmitter 202 contains three identical encoders 214, 216, 218, each driving one respective serial TMDS data channel 206, 208, 210. The input to each encoder 214, 216, 218, in this example, comprises two control signals and eight bits of pixel data. For example, a first encoder 214 encodes eight bits of BLUE pixel data, a second encoder 216 encodes eight bits of GREEN pixel data, and a third encoder 218 encodes eight bits of RED pixel data. Depending on the state of the DE input 207, each encoder will produce 10-bit TMDS words from either the two control signals or from the eight bits of pixel data. These 10-bit TMDS words are then transmitted across the respective channel 206, 208, 210 of the serial link 104 utilizing TMDS protocol. In this example, the serial link 104 is also a TMDS link 104, although other protocols of communicating information across the serial link may be followed in accordance with alternative preferred embodiments of the present invention.

On the other side of the serial link 104, at the TMDS receiver 204 the output of each of the three decoders 224, 226, 228, is a continuous stream of TMDS words having transitions that are synchronized to the clock signal at the clock output 239. The TMDS receiver 204, at the digital display interface 128, activates its data output 235 and provides recovered pixel data transitions only when the DE output 237 is active, and alternatively activates the control data output 233 and provides recovered control data transitions only when the DE output 237 is inactive.

Channel 0 206 of the TMDS serial link 104 is communicatively coupled to the Left decoder 224 at the left (top of FIG. 2) input. In this example, the corresponding encoder 214 at the TMDS transmitter 202 receives eight (8) bits of Blue pixel data and, after the interchannel alignment module 230 organizes the data streams from the decoders 224, 226, 228, then 8 bits at the data output 235 provides the Blue pixel data.

The Channel 1 208 of the TMDS serial link 104 is communicatively coupled to the Center decoder 226 at the center input. According to the present example, the corresponding encoder 216 at the TMDS transmitter 202 receives 8 bits of Green pixel data and, after the interchannel alignment module 230 organizes the data streams from the decoders 224, 226, 228, then 8 bits at the data output 235 provides the Green pixel data.

Lastly, the Channel 2 210 of the TMDS serial link 104 is communicatively coupled to the Rightdecoder 228 at the right (bottom of FIG. 2) input. Further according to the present example, the corresponding encoder 218 at the TMDS transmitter 202 receives eight (8) bits of Red pixel data and, after the interchannel alignment module 230 organizes the data streams from the decoders 224, 226, 228, then eight (8) bits at the data output 235 provides the Red pixel data.

Control signals are delivered from the control input 203 of the TMDS transmitter 202 to the control output 233 of the TMDS receiver 204.

The serial link 104 includes a clock channel (Channel C) 212 that delivers a frequency reference from the TMDS transmitter 202 to the TMDS receiver 204. From this frequency reference the TMDS receiver 204 produces a bit-rate sample clock for the incoming serial streams in the other three channels 206, 208, 210. The TMDS receiver 204 provides this bit rate sample clock to the three decoders 224, 226, 228.

Each decoder 224, 226, 228, of the TMDS receiver 204 determines the location of word boundaries in the serial data streams from the respective channels 206, 208, 210, independently and contemporaneously. Once word boundaries are established on all data channels 206, 208, 210, the TMDS receiver 204 can fully decode TMDS words from the data channels 206, 208, 210, for a decoding operational sequence as will be discussed in detail below.

According to the TMDS protocol, in this example, the TDMS data stream provides periodic cues for decoder synchronization, such as a reserved code word to indicate start of transmission and/or the number of bit transitions embedded in data codewords versus control codewords. These cues help the decoders 224, 226, 228, determine where they are operating in a data stream being received from the TMDS link 104.

The TMDS words that represent the pixel data contain five or fewer transitions, while the TMDS words that represent the control data contain seven or more transitions. According to the present example, the high-transition content of the TMDS words transmitted during a blanking period of a video signal can form the basis for TMDS word boundary synchronization at the TMDS decoders 224, 226, 228. While the TMDS words are individually unique in the serial data stream, they are sufficiently alike that the TMDS decoders 224, 226, 228 may uniquely detect the presence of a succession of them during transmitted blanking intervals of a video signal.

The TMDS data channel 206, 208, 210, is typically driven with a continuous stream of 10 bit TMDS words. During the blanking period there are four distinct words that are transmitted. During active data, when each 10-bit word contains eight bits of pixel data, the encoded words provide an approximate DC balance as well as a reduction in the number of transitions in the data stream. Each TMDS encoder 214, 216, 218, produces a transition-minimized nine-bit code word from the eight bits of data input 205. The TMDS encoder 214, 216, 218, then produces a 10-bit code word that will manage the overall DC balance of the transmitted data stream of words over the respective data channel 206, 208, 210.

The nine-bit code word produced by the TMDS encoder 214, 216, 218 comprises an eight-bit representation of the transitions found in the input eight bits, plus a one-bit flag. The least significant bit of the output matches the least significant bit of the input. With a starting value established, the remaining seven bits of the output word is derived from sequential exclusive OR (XOR) or exclusive NOR (XNOR) functions of each bit of the input with the previously derived bit. The choice between XOR and XNOR logic is made such that the encoded values contain the fewest possible transitions, and the ninth bit of the code word is used to indicate whether XOR or XNOR functions were used to derive the output code word. The decode of this nine-bit code word is a matter of applying either XOR or XNOR gates to the adjacent bits of the code word, with the least significant bit passing from decoder input to decoder output unchanged.

The TMDS encoder 214, 216, 218, during active data periods on the graphics host interface 118 performs an approximate DC balance on the transmitted data stream by selectively inverting the eight data bits of the nine-bit code words produced by the first stage. A tenth bit is added to the code word, to indicate when the inversion has been made. The TMDS encoder 214, 216, 218, determines when to invert the next TMDS word based on the running disparity between ones and zeros that it tracks in the transmitted stream, and the number of ones and zeros found in the current code word. If too many ones have been transmitted and the input data contains more ones that zeros, the code word is inverted. This dynamic encoding decision at the TMDS transmitter 202 is then decoded at the TMDS receiver 204 by the conditional inversion of the input code word based on the tenth bit of the received TMDS word.

According to the present example, a single-link TMDS transmitter 202 includes three identical encoders 214, 216, 218, to which the input stream signals are mapped. Two control signals and eight bits of pixel data are mapped to each encoder. The TMDS receiver 204 includes corresponding decoders 224, 226, 228, that receive and decode TMDS protocol communication across the TMDS serial link 104.

Alternatively, a dual-link transmitter (not shown) incorporates an additional three encoders (not shown) for an additional three data channels (not shown) in the TMDS serial link 104. The dual link configuration transmits odd pixels of each horizontal line on the first link and even pixels of each horizontal line on the second link. The first pixel of each line is pixel number one, an odd pixel. The TMDS receiver 204, according to this alternative embodiment, includes corresponding decoders (not shown) that receive and decode TMDS protocol communication across the TMDS serial link 104. This dual-link alternative increases the effective bit rate across the TMDS serial link 104 by approximately 100%, while utilizing the same clock rate as a single-link communication system implementation.

According to the preferred embodiment of the present invention, a Phase Locked Loop (PLL) module (not shown) in the TMDS receiver 204 recovers the clock signal present on the clock channel 212 in the TMDS serial link 104. The PLL module (not shown) generates 30 sampling clocks evenly distributed over one clock cycle. A sampling module (not shown) acquires 30 samples (30 bits) during one clock cycle. A preferred embodiment of a sampling module that is suitable for use with the present invention is taught in related U.S. patent application Ser. No. 10/037,967, which was filed on Dec. 21, 2001, with title "High Speed Differential Data Sampling Circuit", and which is commonly owned by the assignee of the present invention and the entire teachings of which being hereby incorporated by reference. However, other forms of sampling modules suitable for use in various applications in accordance with the present invention should be obvious to those of ordinary skill in the art in view of the teachings of the present invention disclosure.

Since there is one rising clock edge for every 10 bits of the TMDS bit stream, corresponding to the duration of one TMDS word of 10 bits, and each decoder 224, 226, 228, samples 30 bits within that time interval, there are effectively three bits sampled for every bit of each TMDS word of 10 bits. Each consecutive $3^{rd}$ bit sampled, therefore, represents another bit of the TMDS word.

An operational sequence for each decoder 224, 226, 228, as will be discussed in more detail below, automatically selects out of the 30 bits sampled the most likely bit that defines the beginning of a new TMDS word. This is an efficient and reliable process for synchronizing a decoder to an incoming serial bit stream in a communication channel. According to the present example, the respective decoder 224, 226, 228, once synchronized to an incoming bit stream in a communication channel, 206, 208, 210, will then provide pixel data at a respective data output 240, 250, 260, and alternatively provide control data at a respective control output 242, 252, 262, and will indicate whether pixel data or control data is active based on a respective data enable (DE) output 244, 254, 264. The interchannel alignment module 230, according to the present example, organizes the pixel data from the three decoders 224, 226, 228, and provides pixel data at the data output 235. Similarly, the interchannel alignment module 230 organizes the control data from the three decoders 224, 226, 228, and provides control data at the control output 233. The interchannel alignment module 230 additionally provides a data enable (DE) output 237 to indicate at the output of the digital display interface 128 when the pixel data output 235 is active and alternatively when the control data output 233 is active.

Figure 3:
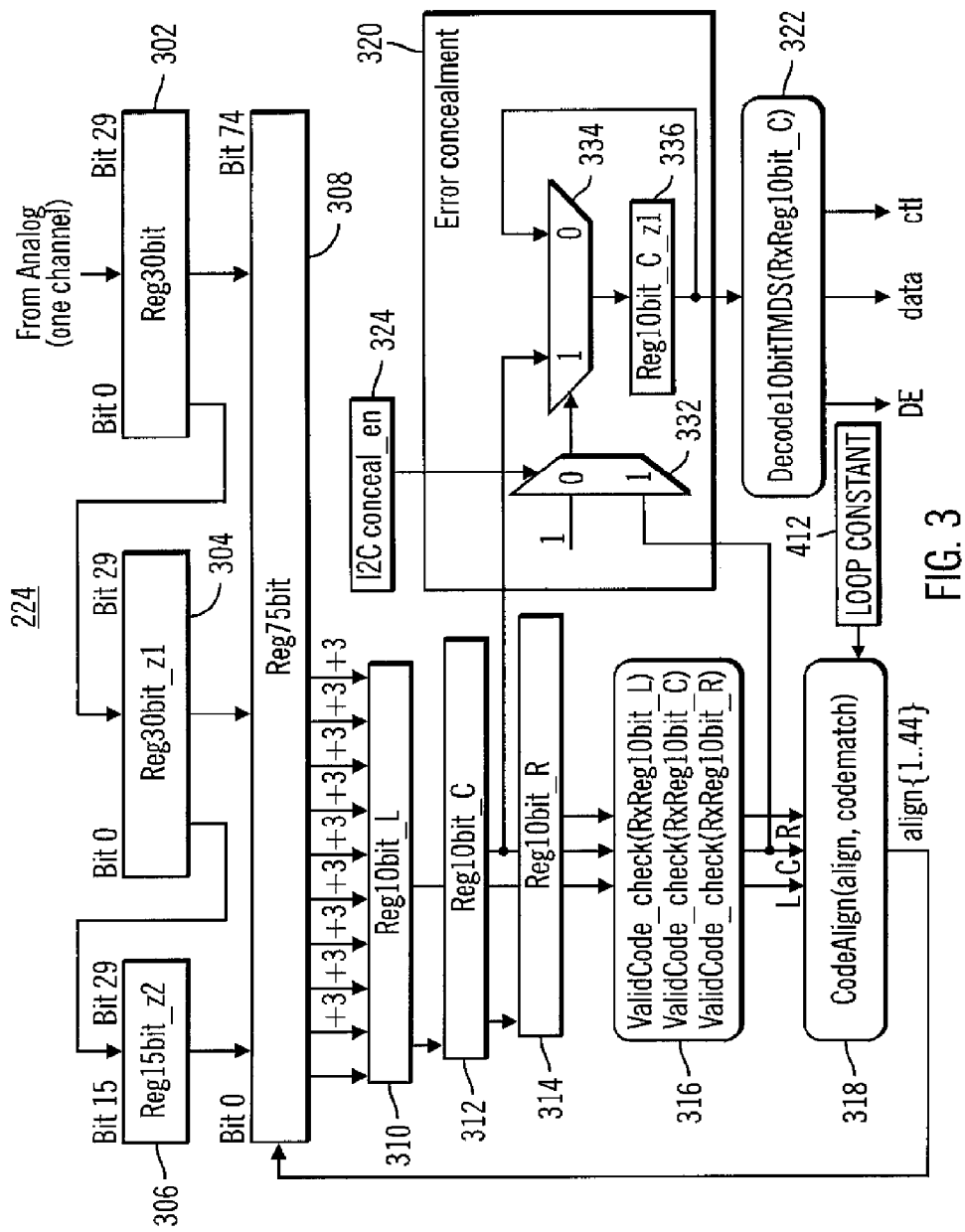
FIGS. 3 & 4 are block diagrams illustrating decoding circuits for an exemplary decoder for use in the video signalling system of FIG. 1, according to a preferred embodiment of the present invention.
Figure 4:
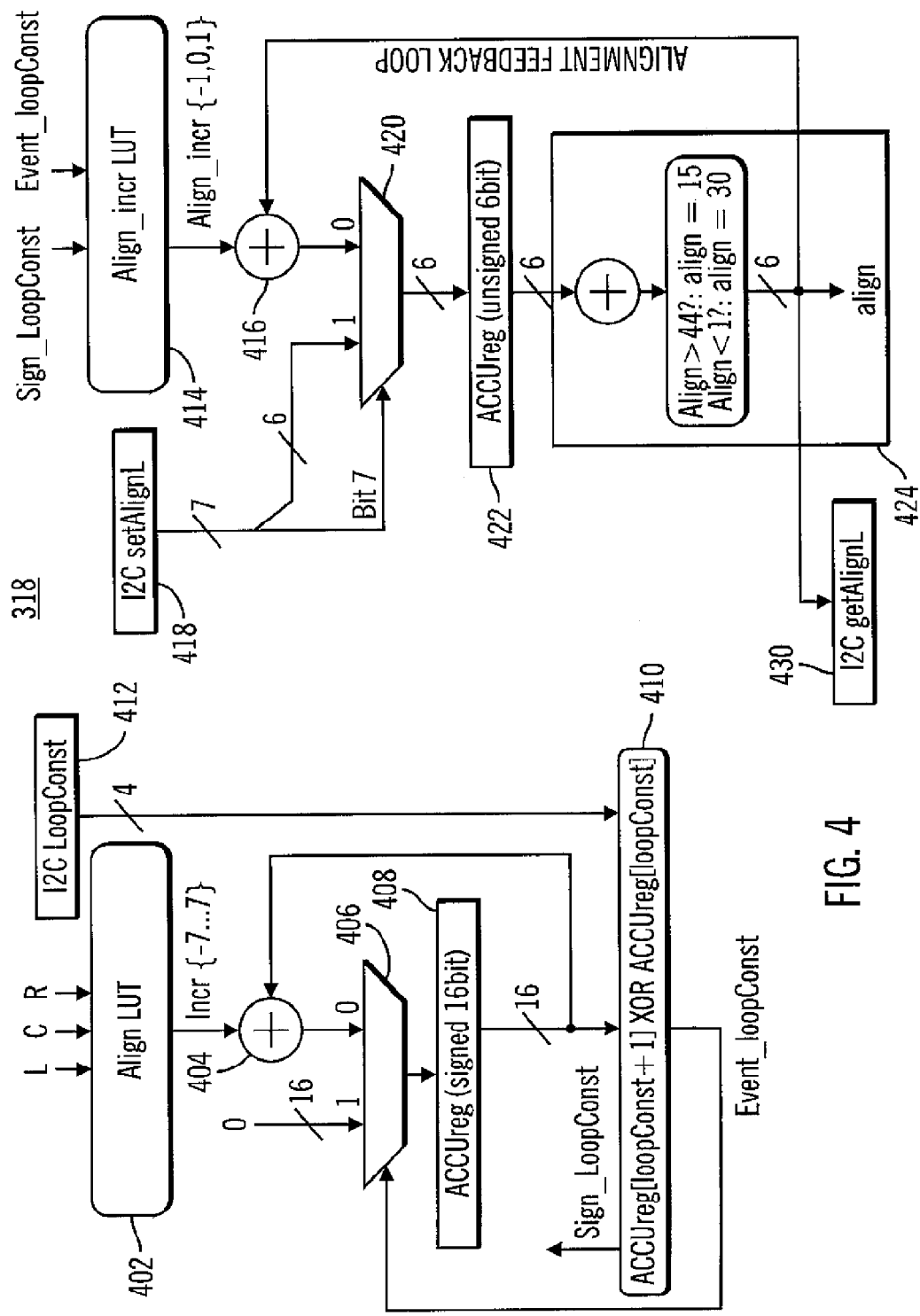

According to an advantageous method of the preferred embodiment of the present invention, each decoder 224, 226, 228, automatically selects out of the 30 bits sampled the most likely bit that defines the beginning of a new TMDS word. That is, the decoder 224, 226, 228, contemporaneously synchronizes to detection of bits and to detection of the word boundaries in a received serial bit stream. The new and novel method and related new and novel circuit components of a preferred embodiment will be discussed in more detail below with reference to FIGS. 3 through 10. A preferred decoder architecture, according to the present example, is shown in FIGS. 3 and 4.

Since there is one rising clock edge for every 10 bits of the TMDS bit stream, corresponding to the duration of one TMDS word of 10 bits, we use a routine AlignBitStream-TMDS-Link ( ) to automatically select out of the 30 bits the most likely bit which defines the beginning of a new TMDS word. Each consecutive $3^{rd}$ bit represents another bit of the TMDS word. In this way the decoder 224, 226, 228, composes the content of the Reg10bit-C register 312, as will be discussed in more detail below.

Before discussing a preferred operational sequence followed by the decoder 224, 226, 228, a preferred architecture for the decoder 224, 226, 228, will be discussed with reference to FIGS. 3 and 4. Each analog channel is communicatively coupled to one sampling module (not shown) receiving 30 bits in one clock cycle. A first 30 bit register 302 receives 30 bits in parallel from the sampling module (not shown). A second 30 bit register 304 is serially linked to the first 30-bit register 302 and receives 30 bits therefrom in one clock cycle. A 15-bit register 306 is serially linked to the second 30 bit register 304 and receives the most significant 15 bits therefrom in one clock cycle.

The three serially linked registers 302, 304, 306 can be clocked to transfer parallel output seventy-five (75) bits to a serial barrel register 308. The barrel register 308 can be controlled to serially shift bits from low bit to high bit position, and further to parallelly transfer out thirty (30) bits into three 10-bit registers, namely the Reg10bit-L register 310, the Reg10bit-C register 312, and the Reg10bit-R register 314. Each of the three registers is communicatively coupled to the barrel register 308 to receive every third bit out of the barrel register 308. The ten (10) bits from each of the three registers 310, 312, 314 are communicatively coupled as an input to a ValidCode checker module 316. The ValidCode checker module 316 outputs three signals, a left, a center, and a right, to indicate whether each of the Reg10bit-L register 310, the Reg10bit-C register 312, and the Reg10bit-R register 314, contains a 10-bit value that matches one of the valid code words for a communication system. The center output signal from the ValidCode checker module 316 controls an error concealment module 320 to enable the 10-bit output from the Reg10bit-C register 312 to be coupled to the output register 336, before the 10-bit TMDS word is decoded in the digital decoder module 322 to output signals DE, data and ctl. Lastly, a CodeAlign module 318 receives three signal inputs from the outputs of the ValidCode checker module 316. The CodeAlign module 318 utilizes the three signals, i.e., the left, the center and the right, to determine whether to adjust the position of bits in the barrel register 308. This adjustment attempts to synchronize the bits in the barrel register 308 such that the Reg10bit-C register 312 will output 10bits that match a valid code word for a communication system. The structure of the CodeAlign module 318 is shown in more detail in FIG. 4, according to a preferred embodiment of the present invention.

As shown in FIG. 4, the three signal outputs (i.e., L, C and R) of the ValidCode checker module 316 are inputs to an Align Look-Up-Table (LUT) module 402. A LUT 1000 such as shown in FIG. 10 is used to look-up a programmable increment value 1008 for incrementing the accumulator 408 using the associated adder and logic circuits 404, 406, and 410, as shown in FIG. 4. A Loop Constant register 412 contains a value that is exclusive OR'd with the output of the accumulator 408 to generate output signals called the Event_loop Constant and the Sign_loop Constant. The Event_loop Constant can take on the values 0 or 1, while the Sign_loop Constant can take on values of −1 or 1. These signals are communicated to an Align_iner LUT module 414 that provides an Align_iner that can take on a value of −1, 0, or 1. The Align_iner is added, via associated adder and logic circuits 416, 420 to an accumulator for a pointer register 422.

This pointer register value 422 is used to index into the barrel shift register 308 to access the next set of 10 bit words for the decoder. A line boundary detection module 424 determines whether the pointer register value 422 is pointing into a valid space in the barrel shift register 308. Note that if the value of the pointer register 422 is greater than 44, then there must be made an adjustment down to 15 to keep the pointer within the operating range of the barrel shift register 308. Similarly, if the pointer value is less than 1, then there must be made an adjustment up to 30 to keep the pointer within the operating range of the barrel shift register 308.

Ultimately, the pointer register value 422 is provided as an output signal (i.e., an alignment value) of the CodeAlign module 318. This output signal is an input to the barrel register 308 to shift the contents of the barrel register 308 to the new position defined by the alignment value. This adjustment then provides a new 10-bit value at the Reg10bit-C register 312 that can be tested for matching to a valid codeword. This process is repeated until a valid codeword is found indicating both a codeword boundary being found and bit synchronization has been obtained. Note that the synchronization of bits and the synchronization of words, according to the preferred embodiment of the present invention, is accomplished contemporaneously.

Continuing with the present example, each respective decoder 224, 226, 228, composes the content of the Reg10bit-C register 312 by contemporaneously monitoring the left, center, and right bit samples in the received serial bit stream to synchronize the decoding to bit detection and further to synchronize to code word boundary detection.

Capturing one sample bit further to the left (of a center bit sample) the decoder composes the content of the Reg10bit-L register 310. Likewise, capturing one sample bit further to the right (of the center bit sample) the decoder composes the content of the Reg10bit-R register 314. Each of the three registers undergoes a valid code check, such as using a routine ValidCode-check( ) in the present example, to test whether the register content matches one of the plurality of valid code words encoded inside a code word Look-Up Table (LUT). Reading three separate signals indentifying a codematch, a function called CodeAlign(align,codematch) in this example, determines the new alignment value for the Reg10bit-C register 312. Since the initial alignment value is unknown and the alignment value, in this example, must stay inside a range between 1 and 44, a realignment undergoes the following test/action:

If (align<1) then align=30.

If (align>44) then align =15.

The new TMDS word, in this example, is then decoded into either 8 bit pixel data or 2 bit control data using a software routine called Decode10bitTMDS (RxReg10bit-C).

The loopConst register 412, in the present example, contains a 4-bit value ranging from 3 to 14 and defines a time constant for a feedback alignment loop. Basically, the loop-Const value is compared to the content of the ACCUiner accumulator 408. When it matches, the content of the ACCUiner accumulator 408 is cleared.

A conversion rule is the following:

(accum-const-*H*accum-const-*L*)<=1<<LoopConst where LoopConst must be an integer value between 3 ... 14. The value of LoopConst is equivalent to the bit position of accum-const-H/L set to 1. All other bits of accum-const-H/L are set to zero.

A setAlignL register 418 allows the decoder 224, 226 and 228 to set the alignment value to a desired start value in the range between 1 and 44. The default value is 8. In this example, it allows for a minimum of +/−2 ns phase shift during normal operation without creating any artifacts (skipping/dropping of pixels). In addition, when bit 7 is set, the alignment feedback loop is opened and the alignment value is controlled entirely by the content of the setAlignL register 418.

Figure 5:
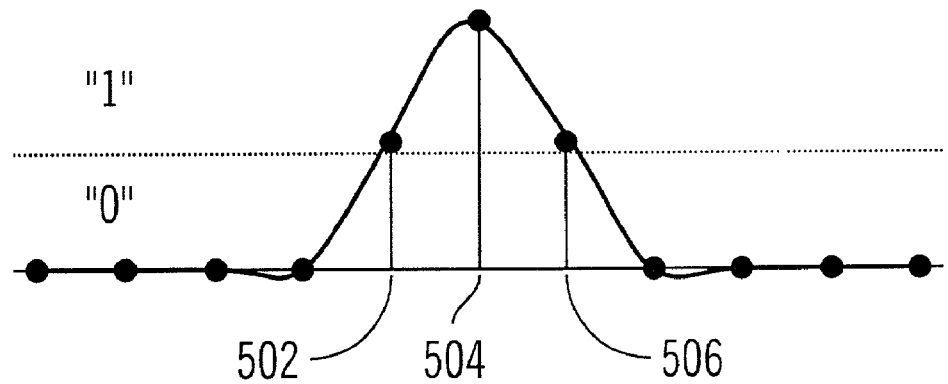
FIGS. 5, 6, and 7, are timing diagrams illustrating three examples of digital signal sampling patterns utilizing three times oversampling, according to a preferred embodiment of the present invention.
Figure 6:
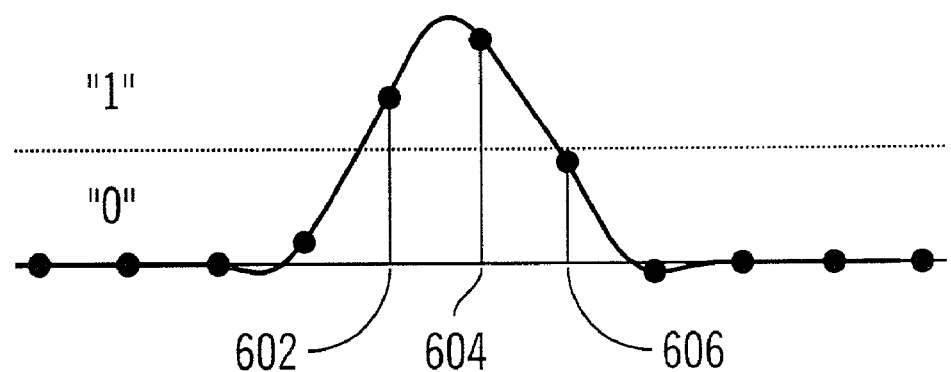
Figure 7:
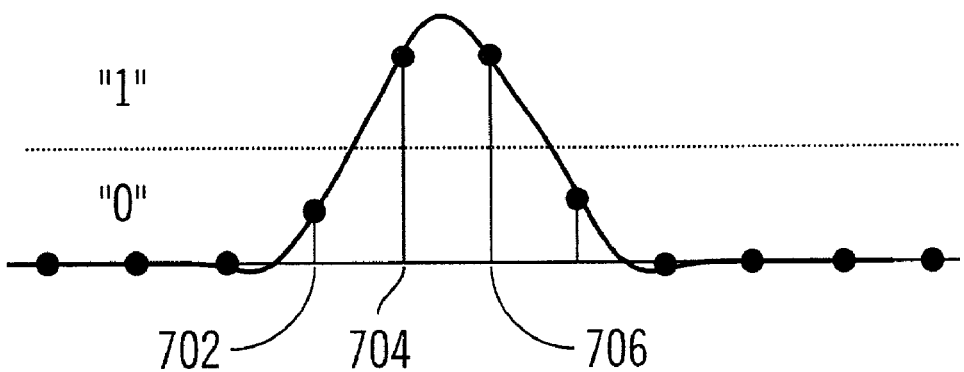

FIGS. 5, 6, and 7, illustrate three examples of digital signal sampling patterns utilizing three times over-sampling, in accordance with a preferred embodiment of the present invention. Recall that, in the present exemplary TMDS receiver 204 the recovered clock signal from the TMDS serial link 104 is divided into 30 evenly distributed samples over each clock cycle. These 30 bits are sampled for every TMDS word of 10 bits, thereby yielding 3 bit samples for every bit of a TMDS word. As illustrated in FIG. 5, the 3 samples 502, 504, 506, of a bit in a TMDS word are nearly perfectly aligned with the bit of the TMDS word such that the center sample 504 is clearly indicating the value of the bit of the TMDS word. However, due to bit jitter in a transmitted bit stream including TMDS words a slight phase shift in a bit of a TMDS word may result in the 3 samples 602, 604, 606, as illustrated in FIG. 6. Note that even under the bit jitter condition illustrated in FIG. 6, the slight phase change will not significantly degrade the detection of the value of the bit of a TMDS word in a bit stream. The center sample 604 is still clearly indicative of the value of the bit of the TMDS word. A much worse condition for sampling a bit stream is illustrated in FIG. 7. In this case, 2 samples 704, 706, indicate the same value and a third sample 702 indicates an opposite value. Here again by 3 times over sampling and thereby detecting 2 out of the 3 samples at a particular value results in a detection of a value for the bit of the TMDS word in the bit stream. Therefore, as can be seen by the examples illustrated in FIGS. 5, 6, and 7, a best case scenario all the way to a worse case scenario of bit jitter results in a high likelihood of detection of the value of a bit of a TMDS word in a bit stream. This is a significant advantage of the preferred embodiment of the present invention.

Figure 8:
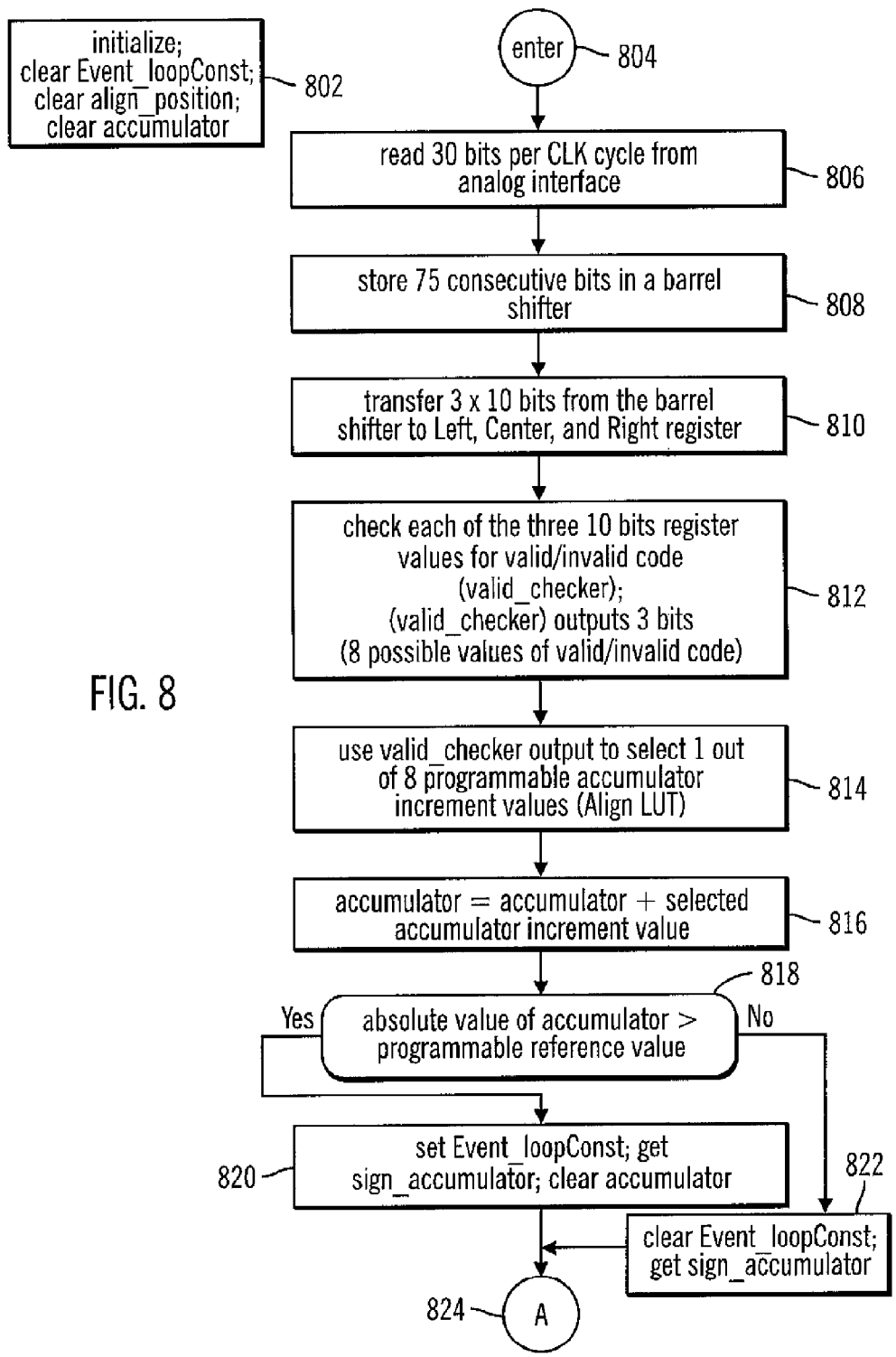
FIGS. 8 and 9 constitute an operational flow diagram illustrating an exemplary decoding operational sequence for the video signalling system of FIG. 1, according to a preferred embodiment of the present invention.
Figure 9:
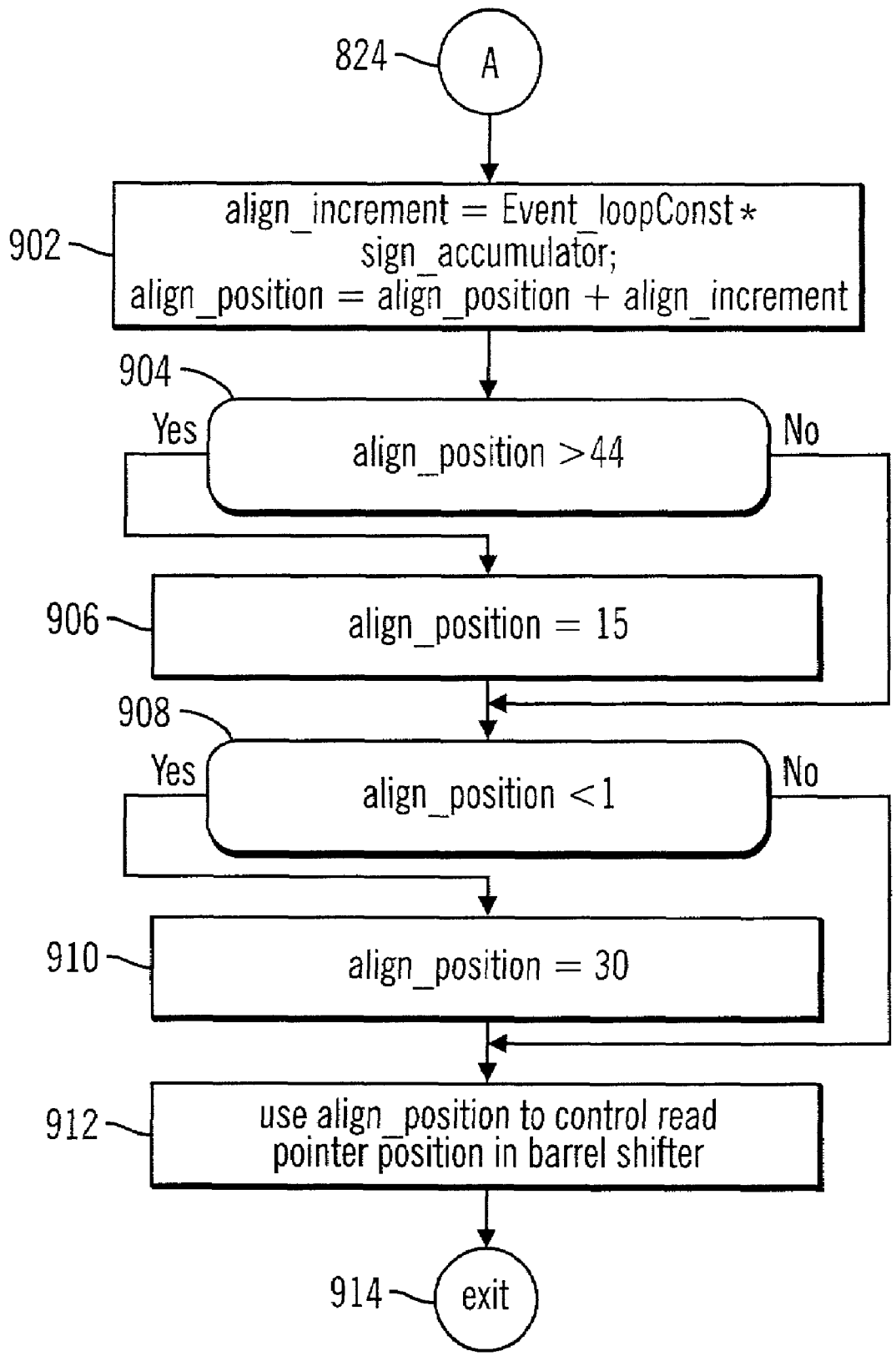

With reference to FIGS. 8, 9, and 10, a new and novel decoding method for a communication system will be discussed below, according to a preferred embodiment of the present invention. Where appropriate, particular reference will be made to the preferred decoder architecture shown in FIGS. 3 and 4.

FIGS. 8 and 9 illustrate a novel operational sequence for each of the decoders 224,226,228, in the TMDS receiver 204, according to a preferred embodiment of the present invention. FIG. 10 illustrates a look-up table 1000 with programmable increment values 1008 that is usable in the operational sequence of FIGS. 8 and 9.

First of all, at step 802, the decoder 224, 226, 228 initializes and clears three variables, namely the event_loop-Const, the align_position, and the accumulator, which will be used in the novel decoding method as will be discussed below. During normal operation, the decoder 224, 226, 228 enters, at step 804, the operation sequence and reads 30 bits per clock cycle from the respective channel 206, 208, 210, at step 806. Note that the channel 206, 208, 210 is considered an analog interface. The 30 bits constitute 30 samples per clock cycle, which is equivalent to a 10 bit TMDS word time interval. At step 808, the decoder 224, 226, 228, according to the present example, stores seventy-five (75) consecutive sample bits in a barrel shift register 308. At step 810, the decoder 224, 226, 228 transfers the first bit of every three bits to a 10-bit left register 310, the second bit of every three bits to a 10-bit center register 312, and the third bit of every three bits to a 10-bit right register 314. At step 812, the decoder 224, 226, 228 performs a valid code check with respect to each of the three 10-bit registers for left, center and right, at valid code checking module 316. The valid checker module 316 outputs three (3) bits with eight (8) possible combinations of valid/invalid code output. Refer to FIG. 10 for the eight possible values of a programmable accumulator increment corresponding to the eight possible values of valid/invalid code determination by the valid code checker module 316. When the valid code checker module 316 determines that the 10-bit left register 310 matches a valid code word found in a code word Look-Up Table, the valid code checker module 316 sets the corresponding output bit to a one, and when no match is found it clears the output bit to zero, as indicated by the L valid column 1002 shown in FIG. 10. Similarly, when the valid code checker module 316 determines that the 10-bit center register 312 matches a valid code word found in a code word Look-Up Table, the valid code checker module 316 sets the output bit to one, and when no match is found it clears the output bit to zero, as indicated by the C valid column 1004 shown in FIG. 10. Lastly, when the 10-bit right register 314 matches a valid code word found in a code word Look-Up Table, the valid code checker module 316 sets the output bit to one, and when no match is found it clears the output bit to zero, as indicated by the R valid column 1006 shown in FIG. 10.

The code align module 318 uses the valid checker module output to select one out of eight programmable accumulator increment values 1008 in the look-up table 1000 as shown in FIG. 10. The decoder 224, 226, 228, therefore, at step 814, performs a look-up in the look-up table 1000 according to the 3 bit values 1002, 1004, 1006, to retrieve a programmable accumulator increment value 1008. At step 816, the accumulator is incremented by the selected accumulator increment value from the look-up table 1000. At step 818, the decoder 224, 226, 228 determines whether the absolute value of the accumulator is greater than a programmable reference value. If it is not greater than the programmable reference value then, at step 822, the decoder 224, 226, 228, clears the variable event loop constant, and gets the sign of the accumulator. Alternatively, if the absolute value of the accumulator is greater than a programmable reference value, at step 818, the decoder 224, 226, 228, sets the event loop constant to one and gets the sign of the accumulator and then clears the accumulator, at step 820.

Continuing on the operational sequence, at step 902, the decoder 224, 226, 228 sets an align increment variable to the current value of the event loop constant, which can have a value of either zero or one, multiplied by the sign of the accumulator, which can have a value of −1 or 1. Therefore, the align increment value can show a value of either −1, zero or 1.Then, continuing at step 902, the decoder 224, 226, 228 sets the align position variable to the align position value incremented by the align increment value just computed. At step 904, if the align position is greater than 44, then the align position is reset to 15, at step 906. Additionally, the decoder 224, 226, 228 determines whether the align position is less than 1, at step 908, if it is less than 1, at step 908, then the align position is reset to 30, at step 910. Lastly, at step 912, the align position is used by the decoder 224, 226, 228 to control the pointer position for reading the 10-bit TMDS word out of the barrel shift register 308, and then exits the operation sequence, at step 914.

The align position, according to an exemplary implementation shown in FIGS. 3 and 4, is an output signal from the code align module 318 which then controls the reposition in the barrel register 308. The reposition then will be adjusted such that the 10 bit center register 312 contains a representation of the TMDS 10 bit code word. These 10 bits from the center register 312 are then transferred to the output 10 bit TMDS register 336 and then to the TMDS decoder 322, which then provides the data and control outputs as well as the data enable output to indicate whether the data output or the control output is active.

An optional error concealment module 320 is controllable by a conceal enable control line 324 that either enables the 10 bit center register output 312 to transfer directly to the 10 bit TMDS output register 336 or it inhibits the transfer of 10 bits from the center register 312 that are not a valid codeword, and maintains at the output of the error concealment module 320 the last 10 bit center register output 336 that was a valid codeword. The center output valid signal from the valid code checker module 316 goes into the error concealment module 320 at a selection circuit 332 the output of which controls a separate selection circuit 334 that is coupled to a 10 bit register 336 as shown in FIG. 3. This circuit arrangement in the error concealment module 320 will block the transfer of a new 10 bit output from the center register 312 when the center valid output bit from the valid code checker module 316 indicates an invalid code word in the 10 bit center register 312. In this way, the error concealment module 320 will maintain a valid 10 bit code word output at the output register 336 that is provided to the decoder 322.

FIG. 4 illustrates an alternative view of the functional components of the code alignment module 318, according to a preferred embodiment of the present invention. An alignment look-up table module 402 receives the left, center and right valid outputs of the valid code checker module 316 and performs a look-up of the look-up table 1000, shown in FIG. 10. The output of the alignment look-up table module 402 is a value that is programmable and stored in the look-up table 1000. This value can range from −7 to 7. This increment value from the alignment look-up table module 402 is added to a previous value of the accumulator register 408, and provided as input to a selector module 406. The selector module 406 is controlled by the Event_Loop constant, which is an output of the XOR module 410. The event_loop constant can have a value of either 0 or 1. If the Event_Loop constant has the value of zero, the output of the selector module 406 will be output of the adder 404; otherwise, if the Event_Loop constant has the value of one, the output of the selector module 406 will be reset to zero. This output of the selector module 406 is an input to the accumulator register 408.

The XOR module 410 exclusive-ORs the output of the accumulator register 408 with a reference value programmable through loop Constant register 412 to generate as an output signal the event loop constant. The event loop constant can have a value of either 0 or 1. The Align increment LUT module 414 multiplies the sign of the accumulator 408, which is indicated by the sign loop constant value, times the event loop constant value. The output of the align increment module 414 can be a value of −1, 0, or 1. Depending on the selection bit of signal 418, which controls the selection circuit 420, the input of the accumulator register 422 will be either 1) the align increment value output of the align increment module 414 added (by the adder 416) with the previous output value of the line boundary detection module 424, or
2) the output signal value of register 418, and this input will be stored in the accumulator register 422 as a new alignment value.

The decoder 224, 226, 228, compares the new alignment value with 44 and if it is greater than 44 it resets the alignment value to 15. Additionally, it compares the new alignment value to 1 and if it is less than 1 it resets the alignment value to 30. The alignment value is then stored in a register 430 and used to align the 10 bits sampled in the left register 310, the center register 312, and the right register 314, using the barrel shift register 308.

Referring to FIG. 10, the look-up table 1000 is shown in accordance with a preferred embodiment of the present invention. The look-up table 1000 includes a series of programmable increment values 1008 that can be used to align the sampling of bits from the barrel shift register 308 according to the method illustrated in FIGS. 8 and 9. The look-up table 1000 includes eight programmable increment values 1008 that correspond to the truth table possible values for three bits 1002, 1004, 1006 that represent whether the left bit 1002, the center bit 1004 and the right bit 1006, are sampled and match a valid code as determined by the valid code checker module 316. When the left bit 1002 is determined valid, this indicates that the 10-bit left register is compared successfully by the valid code checker module 316 to one of the valid codes in the code space for the TMDS protocol. This is shown in FIG. 10 by a "1" being listed in the column for the left bit 1002. A "0" indicates an invalid left bit 1002. That is, the 10-bit left register 310 is compared by the valid code checker module 316 and does not match any of the valid codes in the TMDS protocol. Similarly, the center bit 1004 indicates with a "1" that the valid code checker module 316 compared the 10-bit center register 312 and found a match with a valid code in the TMDS protocol. A "0" for the center bit 1004 indicates that there was no match to any of the valid codes. Likewise, a "1" for the right bit 1006 indicates that the valid code checker module 316 compared the 10-bit right register 314 and found its contents to match one of the valid codes in the TMDS protocol. A "0" for the right bit 1006 indicates that there was no match found to a valid code in the TMDS protocol.

As can be seen in FIG. 10, the look-up table 1000 can be changed, e.g., programmed with alignment increment values, for different particular applications and ultimately serve the purpose of aligning the sampling of the incoming bit stream to best sample and extract the value of the synchronized code word in a bit stream being received from a communication channel. In this case, for example, when all 3 sampled 10 bit registers indicate no match with valid code words, as illustrated by the first row where there are 3 zeros for the 3 output bits 1002,1004, 1006, the programmable increment value 1008 is set to 4. If the right bit is valid 1006 while the left bit and center bit 1002, 1004, are invalid then the programmable increment value 1008 is set to 7. If the left bit 1002 is determined valid and the center bit 1004 and the right bit 1006 are determined invalid then the programmable increment value 1008 is set to negative 7. In this example, all other programmable increment values 1008 are set to zero. That is, if at least 2 out of the 3 sample bits are valid then the present method determines that no increment is needed and therefore the programmable increment value 1008 is set to zero.

The TMDS protocol, according to the present example, provides two 10 bit words for 8 bits of data to be transmitted in the TMDS serial link 104. Eight bits yield 256 combinations×2=512 potentially valid words. A 10 bit TMDS word can yield up to 1024 combinations where only 512 are potentially valid. Of the 512 potentially valid combinations the TMDS protocol currently only utilizes 460. If one of the remaining 52 unused combinations is detected, however, the resulting decoding yields the correct 8 bit data nonetheless. Therefore, according a preferred embodiment of the present invention, the decoding is preferably designed for detecting a match to the 512 potential combinations of bit patterns rather than the 460 that are currently used in the TMDS protocol.

With respect to control data, according to the present example, there are four (4) unique 10-bit control words which that are handled in the TMDS communication protocol at present. By decoding and matching the eight (8) most significant bits out of a 10-bit code word, the decoding method can identify the valid 10-bit code words for control data.

The present invention can be realized in hardware, software, or a combination of hardware and software. A system according to a preferred embodiment of the present invention can be realized in a centralized fashion in one computer system, or in a distributed fashion where different elements are spread across several interconnected computer systems. Any kind of computer system, or other apparatus or integrated circuit adapted for carrying out the methods described herein, is suited. A typical combination of hardware and software could be a general purpose computer system with a computer program that, when being loaded and executed, controls the computer system such that it carries out the methods described herein.

A preferred embodiment of the present invention can also be embedded in a computer program product, which comprises all the features enabling the implementation of the methods described herein, and which—when loaded in a computer system—is able to carry out these methods. Computer program means or computer program in the present context mean any expression, in any language, code or notation, of a set of instructions intended to cause a system having an information processing capability to perform a particular function either directly or after either or both of the following a) conversion to another language, code or, notation; and b) reproduction in a different material form.

Each computer system may include, inter alia, one or more computers and at least a computer readable medium allowing a computer to read data, instructions, messages or message packets, and other computer readable information from the computer readable medium. The computer readable medium may include non-volatile memory, such as ROM, Flash memory, Disk drive memory, CD-ROM, and other permanent storage. Additionally, a computer medium may include, for example, volatile storage such as RAM, buffers, cache memory, and network circuits. Furthermore, the computer readable medium may comprise computer readable information in a transitory state medium such as a network link and/or a network interface, including a wired network or a wireless network, that allow a computer to read such computer readable information.

The decoding system according to the present invention provides significant advantages over the known prior art. The present decoding system can be much more accurate and efficient at reconstructing digital signals being delivered across the serial link 104. This decoding system according to the preferred embodiments of the present invention provides a practical approach to accurately and reliably recover digital video signal information transmitted over the serial link 104 such as for a digital display. This enhances the quality of a video image that is presented via a digital display of the video monitor to a user. The result is a higher opinion of the quality of the digital display video monitor system and increased commercial viability of such products.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A communication system comprising:
   means for generating a clock cycle;
   a receiver for receiving a serial bit stream from at least one communication channel; and
   a decoder, communicatively coupled to the receiver, for decoding words from the received serial bit stream, the words being defined at least in part by word boundaries in the received serial bit stream, the decoder synchronizing during a same clock cycle to received bits and to the detection of the word boundaries in the received serial bit stream.

2. The communication system of claim 1, wherein the decoder three times oversamples bits from the received serial bit stream.

3. The communication system of claim 1, wherein the decoder synchronizes to words from the received serial bit stream according to a Transition Minimized Differential Signalling protocol.

4. The communication system of claim 1, wherein each word from the received serial bit stream comprises 10 bits, and wherein the decoder samples 30 bits from the received serial bit stream within a time interval substantially equal to that for receiving the 10 bits of a word from the received serial bit stream.

5. The communication system of claim 1, wherein the decoder synchronizes to words from the received serial bit stream by determining whether a bit pattern from the received serial bit stream matches any one of a plurality of valid code words for representing data being delivered in the received serial bit stream.

6. The communication system of claim 5, wherein the plurality of valid code words represent at least one of pixel data and control data for delivering digitized video signal information in the serial bit stream from the at least one communication channel.

7. The communication system of claim 5, wherein the plurality of valid code words comprises Transition Minimized Differential Signalling code words, and wherein the decoder synchronizes to words from the received serial bit stream by determining whether a bit pattern from the received serial bit stream matches any one of the Transition Minimized Differential Signalling code words.

8. A method comprising:
receiving a serial bit stream from at least one communication channel;
decoding words from the received serial bit stream, the words being defined at least in part by word boundaries in the received serial bit stream; and
contemporaneously synchronizing to received bits and to the detection of the word boundaries in the received serial bit stream.

9. The method of claim 8, wherein the decoding comprises three times oversampling bits from the received serial bit stream.

10. The method of claim 8, wherein the decoding comprises synchronizing to words from the received serial bit stream according to a Transition Minimized Differential Signalling protocol.

11. The method of claim 8, wherein each word from the received serial bit stream comprises 10 bits, and wherein the decoding comprises sampling 30 bits from the received serial bit stream within a time interval substantially equal to that for receiving the 10 bits of a word from the received serial bit stream.

12. The method of claim 8, wherein the decoding comprises synchronizing to wards from the received serial bit stream by determining whether a bit pattern from the received serial bit stream matches any one of a plurality of valid code words for representing data being delivered in the received serial bit stream.

13. The method of claim 12, wherein the plurality of valid code words represent at least one of pixel data and control data for delivering digitized video signal information in the serial bit stream from the at least one communication channel.

14. The method of claim 12, wherein the plurality of valid code words comprises Transition Minimized Differential Signalling code words, and wherein the decoding comprises synchronizing to words from the received serial bit stream by determining whether a bit pattern from the received serial bit stream matches any one of the Transition Minimized Differential Signalling code words.

15. A circuit supporting substrate comprising:
a substrate; and
an electronic circuit disposed on the circuit supporting substrate, the electronic circuit comprising:
means for generating a clock cycle;
a receiver for receiving a serial bit stream from at least one communication channel; and
a decoder, communicatively coupled to the receiver, for decoding words from the received serial bit stream, the words being defined at least in part by word boundaries in the received serial bit stream, the decoder synchronizing during a same clock cycle to received bits and to the detection of the word boundaries in the received serial bit stream.

16. The circuit supporting substrate of claim 15, wherein the circuit supporting substrate comprises an integrated circuit chip that includes the substrate and the electronic circuit.

17. The circuit supporting substrate of claim 15, wherein the decoder three times oversamples bits from the received serial bit stream.

18. The circuit supporting substrate of claim 15, wherein the decoder synchronizes to words from the received serial bit stream according to a Transition Minimized Differential Signalling protocol.

19. The circuit supporting substrate of claim 15, wherein each word from the received serial bit stream comprises 10 bits, and wherein the decoder samples 30 bits from the received serial bit stream within a time interval substantially equal to that for receiving the 10 bits of a word from the received serial bit stream.

20. The circuit supporting substrate of claim 15, wherein the decoder synchronizes to words from the received serial bit stream by determining whether a bit pattern from the received serial bit stream matches any one of a plurality of valid code words for representing data being delivered in the received serial bit stream.

21. The circuit supporting substrate of claim 20, wherein the plurality of valid code words comprises Transition Minimized Differential Signalling code words, and wherein the decoder synchronizes to words from the received serial bit stream by determining whether a bit pattern from the received serial bit stream matches any one of the Transition Minimized Differential Signalling code words.

22. The circuit supporting substrate of claim 15, wherein the plurality of valid code words represent at least one of pixel data and control data for delivering digitized video signal information in the serial bit stream from the at least one communication channel.

23. A decoder for decoding words, comprising:
means for generating a clock cycle;
a sampling module for receiving a serial bit stream on an analog communication channel, and for continually sampling, at equally-spaced temporal intervals, the serial bit stream such that 3N samples are taken during a clock cycle substantially equal to a time period for receiving N bits of an N-bit word from the received serial bit stream;
a 3N-bit barrel register for continually receiving the 3N samples from the sampling module;

a left N-bit register in parallel communication with the barrel register for receiving, during each clock cycle, the first bit relative to an index position in the barrel register and every third bit thereafter in the barrel register;

a center N-bit register in parallel communication with the barrel register for receiving during each clock cycle, the second bit relative to the index position in the barrel register and every third bit thereafter in the barrel register;

a right N-bit register in parallel communication with the barrel register for receiving during each clock cycle, the third bit relative to the index position in the barrel register and every third bit thereafter in the barrel register;

a look-up table in which is stored a plurality of valid N-bit words;

means for comparing, during each clock cycle, contents of the left N-bit register, the center N-bit register and the right N-bit register with contents of the look-up table, and generating three signals responsive to a match between the contents of the left N-bit register, the center N-bit register and the right N-bit register, respectively, with contents of the look-up table; and a code align module for adjusting, based upon the three signals, prior to a subsequent clock cycle, the index position of the bits within the barrel register, until the contents of the center N-bit register matches a valid code word, thereby decoding a valid N-bit word.

24. The decoder of claim 23, wherein the decoding comprises synchronizing to words from the received serial bit stream according to a Transition Minimized Differential Signalling protocol.

25. The decoder of claim 23, wherein each word from the received serial bit stream comprises 10 bits, and wherein the decoding comprises sampling 30 bits from the received serial bit stream within a time interval substantially equal to that for receiving the 10 bits of a word from the received serial bit stream.

26. The decoder of claim 23, wherein the plurality of valid N-bit words represent at least one of pixel data and control data for delivering digitized video signal information in the serial bit stream from the analog communication channel.

27. The decoder of claim 23, wherein the plurality of valid N-bit words comprises Transition Minimized Differential Signalling code words, and wherein the decoding comprises synchronizing to words from the received serial bit stream by determining whether a bit pattern from the received serial bit stream matches any one of the Transition Minimized Differential Signalling code words.

28. The decoder of claim 23, in which word synchronization and bit synchronization are both accomplished during a same clock cycle.

29. The decoder of claim 23, in which bit synchronization is performed during every clock cycle while decoding a valid N-bit word.

* * * * *